(12) United States Patent
Nohr et al.

(10) Patent No.: US 6,486,227 B2
(45) Date of Patent: Nov. 26, 2002

(54) ZINC-COMPLEX PHOTOINITIATORS AND APPLICATIONS THEREFOR

(75) Inventors: Ronald Sinclair Nohr, Alpharetta, GA (US); John G. MacDonald, Decatur, GA (US)

(73) Assignee: Kimberly-Clark Worldwide, Inc., Neenah, WI (US)

( * ) Notice: Subject to any disclaimer, the term of this patent is extended or adjusted under 35 U.S.C. 154(b) by 0 days.

(21) Appl. No.: 09/884,896

(22) Filed: Jun. 19, 2001

(65) Prior Publication Data
US 2002/0099111 A1 Jul. 25, 2002

Related U.S. Application Data
(60) Provisional application No. 60/212,428, filed on Jun. 19, 2000.

(51) Int. Cl.[7] ............................. C08F 2/50; G03F 7/079
(52) U.S. Cl. ............................. 522/50; 522/63; 522/66; 522/16; 522/26; 430/281.1; 544/106; 546/298; 549/13; 556/130
(58) Field of Search ................... 522/50, 63, 66, 522/16, 26; 430/281.1; 544/106, 109; 546/298; 549/13, 14; 556/130, 135

(56) References Cited

U.S. PATENT DOCUMENTS

| | | |
|---|---|---|
| 28,789 A | 4/1860 | Chang |
| 28,225 A | 11/1860 | Heseltine et al. |
| 1,013,544 A | 1/1912 | Fuerth |
| 1,325,971 A | 12/1919 | Akashi |
| 1,364,406 A | 1/1921 | Olsen |
| 1,880,572 A | 10/1932 | Wendt et al. |
| 1,880,573 A | 10/1932 | Wendt et al. |
| 1,916,350 A | 7/1933 | Wendt et al. |
| 1,916,779 A | 7/1933 | Wendt et al. |
| 1,955,898 A | 4/1934 | Wendt et al. |
| 2,049,005 A | 7/1936 | Gaspar |
| 2,054,390 A | 9/1936 | Rust et al. |
| 2,062,304 A | 12/1936 | Gaspar |
| 2,097,119 A | 10/1937 | Eggert |
| 2,125,015 A | 7/1938 | Gaspar |

(List continued on next page.)

FOREIGN PATENT DOCUMENTS

| | | |
|---|---|---|
| AU | 103085 | 4/1937 |
| AU | 12624/88 | 9/1988 |
| CA | 458808 | 12/1936 |
| CA | 461082 | 11/1949 |
| CA | 571792 | 3/1959 |
| CA | 779239 | 2/1968 |
| CA | 93103 | 7/1973 |
| CA | 2053094 | 4/1992 |
| CH | 603767 | 8/1978 |
| CH | 197808 | 5/1988 |
| DE | 1047787 | 12/1957 |
| DE | 1039835 | 9/1958 |
| DE | 1040562 | 10/1958 |
| DE | 1045414 | 12/1958 |
| DE | 1047013 | 12/1958 |

(List continued on next page.)

OTHER PUBLICATIONS

Noguchi, H. UV Curable, Aqueous Ink Jet Ink: Material Design and Performance for Digital Printing *1998 International Conf. on Digital Printing Technologies* pp. 107–110 Dec. 31, 1998.

ESP@CENE T databse JP 10324836 (Omron Corp.), Dec. 8, 1998. abstract Dec. 8, 1998.

Derwent World Patents EP 659039 (Canon KK) Jun. 21, 1995. abstract Jun. 21, 1995.

Maki, Y. et al. "A novel heterocyclic N–oxide, pyrimido[5,4–g]pteridinetetrone 5–oxide, with multifunctional photooxidative properties" *Chemical Abstracts* vol. 122 p. 925 Jan. 1, 1995.

(List continued on next page.)

*Primary Examiner*—Susan W. Berman
(74) *Attorney, Agent, or Firm*—Kilpatrick Stockton LLP

(57) ABSTRACT

The present invention is directed to energy-efficient, photoinitiators having the general formula:

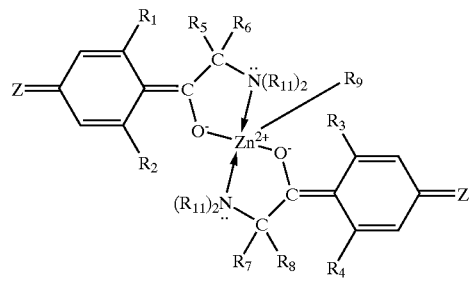

wherein Z each independently represent

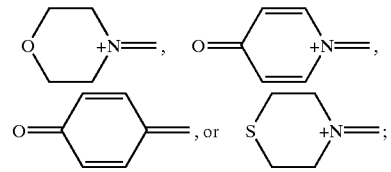

wherein $R_1$, $R_2$, $R_3$, $R_4$, $R_5$, $R_6$, $R_7$, $R_8$ are as defined in claim 1, and wherein $R_9$ represents $(R_{10})_2O$ or $(R_{10})_3N$; wherein $R_{10}$ represents H or an alkyl group having from one to eight carbon atoms; and wherein $R_{11}$ represents H, an alkyl group having from one to eight carbon atoms, a benzyl group or an aralkyl group. The present invention is also directed to a method of generating a reactive species, methods of polymerizing polymerizable materials, methods of curing an unsaturated oligomer/monomer mixture, and methods of laminating using the photoinitiators of the present invention. In addition, the present invention is directed to ink compositions, adhesive compositions and resins, and methods of printing using the above-described photoinitiators.

20 Claims, No Drawings

U.S. PATENT DOCUMENTS

| | | |
|---|---|---|
| 2,130,572 A | 9/1938 | Wendt |
| 2,132,154 A | 10/1938 | Gaspar |
| 2,145,960 A | 2/1939 | Wheatley et al. |
| 2,159,280 A | 5/1939 | Mannes et al. |
| 2,220,178 A | 11/1940 | Schneider |
| 2,230,590 A | 2/1941 | Eggert et al. |
| 2,268,324 A | 12/1941 | Polgar |
| 2,281,895 A | 5/1942 | van Poser et al. |
| 2,312,751 A | 3/1943 | Cohen |
| 2,328,166 A | 8/1943 | Polgar et al. |
| 2,346,090 A | 4/1944 | Staehle |
| 2,416,145 A | 2/1947 | Biro |
| 2,647,080 A | 7/1953 | Joyce |
| 2,732,301 A | 1/1956 | Robertson et al. |
| 2,757,090 A | 7/1956 | Meugebauer et al. |
| 2,763,550 A | 9/1956 | Lovick |
| 2,936,241 A | 5/1960 | Sharp et al. |
| 2,940,853 A | 6/1960 | Sagura et al. |
| 2,992,198 A | 7/1961 | Funahashi et al. |
| 3,030,208 A | 4/1962 | Schellenberg et al. |
| 3,104,973 A | 9/1963 | Sprague et al. |
| 3,114,634 A | 12/1963 | Brown et al. |
| 3,121,632 A | 2/1964 | Sprague et al. |
| 3,123,647 A | 3/1964 | Duennenberger et al. |
| 3,140,949 A | 7/1964 | Sprague et al. |
| 3,154,416 A | 10/1964 | Fidelman |
| 3,155,509 A | 11/1964 | Roscow |
| 3,175,905 A | 3/1965 | Wiesbaden |
| 3,178,285 A | 4/1965 | Anderau et al. |
| 3,284,205 A | 11/1966 | Sprague et al. |
| 3,300,314 A | 1/1967 | Rauner et al. |
| 3,305,361 A | 2/1967 | Gaynor et al. |
| 3,330,659 A | 7/1967 | Wainer |
| 3,341,492 A | 9/1967 | Champ et al. |
| 3,359,109 A | 12/1967 | Harder et al. |
| 3,385,700 A | 5/1968 | Willems et al. |
| 3,397,984 A | 8/1968 | Williams et al. |
| 3,418,118 A | 12/1968 | Thommes et al. |
| 3,445,234 A | 5/1969 | Cescon et al. |
| 3,479,185 A | 11/1969 | Chambers |
| 3,488,269 A | 1/1970 | Allen et al. |
| 3,502,476 A | 3/1970 | Kohei et al. |
| 3,503,744 A | 3/1970 | Itano et al. |
| 3,514,597 A | 5/1970 | Haes et al. |
| 3,547,646 A | 12/1970 | Hori et al. |
| 3,549,367 A | 12/1970 | Chang et al. |
| 3,574,624 A | 4/1971 | Reynolds et al. |
| 3,595,655 A | 7/1971 | Robinson et al. |
| 3,595,657 A | 7/1971 | Robinson et al. |
| 3,595,658 A | 7/1971 | Gerlach et al. |
| 3,595,659 A | 7/1971 | Gerlach et al. |
| 3,607,639 A | 9/1971 | Krefeld et al. |
| 3,607,693 A | 9/1971 | Heine et al. |
| 3,607,863 A | 9/1971 | Dosch |
| 3,615,562 A | 10/1971 | Harrison et al. |
| 3,617,288 A | 11/1971 | Hartman et al. |
| 3,642,472 A | 2/1972 | Mayo |
| 3,647,467 A | 3/1972 | Grubb |
| 3,667,954 A | 6/1972 | Itano et al. |
| 3,671,096 A | 6/1972 | Mackin |
| 3,671,251 A | 6/1972 | Houle et al. |
| 3,689,565 A | 9/1972 | Hoffmann et al. |
| 3,694,241 A | 9/1972 | Guthrie et al. |
| 3,695,879 A | 10/1972 | Laming et al. |
| 3,697,280 A | 10/1972 | Strilko |
| 3,705,043 A | 12/1972 | Zablak |
| 3,707,371 A | 12/1972 | Files |
| 3,729,313 A | 4/1973 | Smith |
| 3,765,896 A | 10/1973 | Fox |
| 3,775,130 A | 11/1973 | Enomoto et al. |
| 3,788,849 A | 1/1974 | Taguchi et al. |
| 3,794,497 A * | 2/1974 | Pratt et al. ............... 430/281.1 |
| 3,801,329 A | 4/1974 | Sandner et al. |
| 3,817,752 A | 6/1974 | Laridon et al. |
| 3,870,524 A | 3/1975 | Watanabe et al. |
| 3,873,500 A | 3/1975 | Kato et al. |
| 3,887,450 A | 6/1975 | Gilano et al. |
| 3,895,949 A | 7/1975 | Akamatsu |
| 3,901,779 A | 8/1975 | Mani |
| 3,914,165 A | 10/1975 | Gaske |
| 3,914,166 A | 10/1975 | Rudolph et al. |
| 3,915,824 A | 10/1975 | McGinniss |
| 3,926,641 A | 12/1975 | Rosen |
| 3,933,682 A | 1/1976 | Bean |
| 3,960,685 A | 6/1976 | Sano et al. |
| 3,984,248 A | 10/1976 | Sturmer |
| 3,988,154 A | 10/1976 | Sturmer |
| 4,004,998 A | 1/1977 | Rosen |
| 4,012,256 A | 3/1977 | Levinos |
| 4,017,652 A | 4/1977 | Gruber |
| 4,022,674 A | 5/1977 | Rosen |
| 4,024,324 A | 5/1977 | Sparks |
| 4,043,819 A | 8/1977 | Baumann |
| 4,048,034 A | 9/1977 | Martan |
| 4,054,719 A | 10/1977 | Cordes, III |
| 4,058,400 A | 11/1977 | Crivello |
| 4,071,424 A | 1/1978 | Dart et al. |
| 4,073,968 A | 2/1978 | Miyamoto et al. |
| 4,079,183 A | 3/1978 | Green |
| 4,090,877 A | 5/1978 | Streeper |
| 4,100,047 A | 7/1978 | McCarty |
| 4,107,733 A | 8/1978 | Schickedanz |
| 4,110,112 A | 8/1978 | Roman et al. |
| 4,111,699 A | 9/1978 | Krueger |
| 4,141,807 A | 2/1979 | Via |
| 4,144,156 A | 3/1979 | Kuesters et al. |
| 4,148,658 A | 4/1979 | Kondoh et al. |
| 4,162,162 A | 7/1979 | Dueber |
| 4,171,977 A | 10/1979 | Hasegawa et al. |
| 4,179,577 A | 12/1979 | Green |
| 4,181,807 A | 1/1980 | Green |
| 4,197,080 A | 4/1980 | Mee |
| 4,199,420 A | 4/1980 | Photis |
| 4,232,106 A | 11/1980 | Iwasaki et al. |
| 4,239,850 A | 12/1980 | Kita et al. |
| 4,245,033 A | 1/1981 | Eida et al. |
| 4,250,096 A | 2/1981 | Kvita et al. |
| 4,251,622 A | 2/1981 | Kimoto et al. |
| 4,251,662 A | 2/1981 | Ozawa et al. |
| 4,258,123 A | 3/1981 | Nagashima et al. |
| 4,259,432 A | 3/1981 | Kondoh et al. |
| 4,268,667 A | 5/1981 | Anderson |
| 4,279,982 A | 7/1981 | Iwasaki et al. |
| 4,279,985 A | 7/1981 | Nonogaki et al. |
| 4,284,485 A | 8/1981 | Berner |
| 4,289,844 A | 9/1981 | Specht et al. |
| 4,290,870 A | 9/1981 | Kondoh et al. |
| 4,306,014 A | 12/1981 | Kunikane et al. |
| 4,307,182 A | 12/1981 | Dalzell et al. |
| 4,308,400 A | 12/1981 | Felder et al. |
| 4,315,807 A | 2/1982 | Felder et al. |
| 4,318,791 A | 3/1982 | Felder et al. |
| 4,321,118 A | 3/1982 | Felder et al. |
| 4,335,054 A | 6/1982 | Blaser et al. |
| 4,343,891 A | 8/1982 | Aasen et al. |
| 4,345,011 A | 8/1982 | Drexhage |
| 4,347,111 A | 8/1982 | Gehlhaus et al. |
| 4,350,753 A | 9/1982 | Shelnut et al. |
| 4,351,893 A | 9/1982 | Anderson |
| 4,356,247 A | 10/1982 | Aotani et al. |
| 4,356,255 A | 10/1982 | Tachikawa et al. |

| | | | | | |
|---|---|---|---|---|---|
| 4,359,524 A | 11/1982 | Masuda et al. | 4,839,269 A | 6/1989 | Okazaki et al. |
| 4,362,806 A | 12/1982 | Whitmore | 4,849,320 A | 7/1989 | Irving et al. |
| 4,367,280 A | 1/1983 | Kondo et al. | 4,853,037 A | 8/1989 | Johnson et al. |
| 4,369,283 A | 1/1983 | Altschuler | 4,857,438 A | 8/1989 | Loerzer et al. |
| 4,370,401 A | 1/1983 | Winslow et al. | 4,861,916 A | 8/1989 | Kohler et al. |
| 4,372,582 A | 2/1983 | Geisler | 4,865,942 A | 9/1989 | Gottschalk et al. |
| 4,373,017 A | 2/1983 | Masukawa et al. | 4,886,774 A | 12/1989 | Doi |
| 4,374,984 A | 2/1983 | Eichler et al. | 4,895,880 A | 1/1990 | Gottschalk |
| 4,383,835 A | 5/1983 | Preuss et al. | 4,902,725 A | 2/1990 | Moore |
| 4,390,616 A | 6/1983 | Sato et al. | 4,925,770 A | 5/1990 | Ichiura et al. |
| 4,391,867 A | 7/1983 | Derick et al. | 4,937,161 A | 6/1990 | Kita et al. |
| 4,416,961 A | 11/1983 | Drexhage | 4,942,113 A | 7/1990 | Trundle |
| 4,424,325 A | 1/1984 | Tsunoda et al. | 4,952,478 A | 8/1990 | Miyagawa et al. |
| 4,425,424 A | 1/1984 | Altland et al. | 4,954,416 A | 9/1990 | Wright et al. |
| 4,434,035 A | 2/1984 | Eichler et al. | 4,956,254 A | 9/1990 | Washizu et al. |
| 4,447,521 A | 5/1984 | Tiers et al. | 4,965,294 A | 10/1990 | Ohngemach et al. |
| 4,450,227 A | 5/1984 | Holmes et al. | 4,987,056 A | 1/1991 | Imahashi et al. |
| 4,475,999 A | 10/1984 | Via | 4,997,745 A | 3/1991 | Kawamura et al. |
| 4,477,681 A | 10/1984 | Gehlhaus et al. | 5,002,853 A | 3/1991 | Aoai et al. |
| 4,489,334 A | 12/1984 | Owatari | 5,002,993 A | 3/1991 | West et al. |
| 4,495,041 A | 1/1985 | Goldstein | 5,003,142 A | 3/1991 | Fuller |
| 4,496,447 A | 1/1985 | Eichler et al. | 5,026,425 A | 6/1991 | Hindagolla et al. |
| 4,500,355 A | 2/1985 | Shimada et al. | 5,028,792 A | 7/1991 | Mullis |
| 4,508,570 A | 4/1985 | Fugii et al. | 5,034,526 A | 7/1991 | Bonham et al. |
| 4,510,392 A | 4/1985 | Litt et al. | 5,045,435 A | 9/1991 | Adams et al. |
| 4,534,838 A | 8/1985 | Lin et al. | 5,045,573 A | 9/1991 | Kohler et al. |
| 4,548,896 A | 10/1985 | Sabongi et al. | 5,047,556 A | 9/1991 | Kohler et al. |
| 4,555,474 A | 11/1985 | Kawamura | 5,053,320 A | 10/1991 | Robbillard |
| 4,559,371 A | 12/1985 | Hiisler et al. | 5,055,579 A | 10/1991 | Pawlowski et al. |
| 4,565,769 A | 1/1986 | Dueber et al. | 5,070,001 A | 12/1991 | Stahlhofen |
| 4,571,377 A | 2/1986 | McGinniss et al. | 5,077,402 A | 12/1991 | Desobry et al. |
| 4,582,862 A | 4/1986 | Berner et al. | 5,087,550 A | 2/1992 | Blum et al. |
| 4,595,745 A | 6/1986 | Nakano et al. | 5,089,374 A | 2/1992 | Saeva |
| 4,604,344 A | 8/1986 | Irving et al. | 5,096,489 A | 3/1992 | Laver |
| 4,605,442 A | 8/1986 | Kawashita et al. | 5,098,806 A | 3/1992 | Robillard |
| 4,620,875 A | 11/1986 | Shimada et al. | 5,106,723 A | 4/1992 | West et al. |
| 4,620,876 A | 11/1986 | Fugii et al. | 5,108,874 A | 4/1992 | Griffing et al. |
| 4,622,286 A | 11/1986 | Sheets | 5,110,706 A | 5/1992 | Yumoto et al. |
| 4,631,085 A | 12/1986 | Kawanishi et al. | 5,110,709 A | 5/1992 | Aoai et al. |
| 4,632,891 A | 12/1986 | Banks et al. | 5,114,832 A | 5/1992 | Zertani et al. |
| 4,632,895 A | 12/1986 | Patel et al. | 5,130,227 A | 7/1992 | Wade et al. |
| 4,634,644 A | 1/1987 | Irving et al. | 5,147,901 A | 9/1992 | Rutsch et al. |
| 4,638,340 A | 1/1987 | Iiyama et al. | 5,153,104 A | 10/1992 | Rossman et al. |
| 4,647,310 A | 3/1987 | Shimada et al. | 5,153,105 A | 10/1992 | Sher et al. |
| 4,655,783 A | 4/1987 | Reinert et al. | 5,166,041 A | 11/1992 | Murofushi et al. |
| 4,663,275 A | 5/1987 | West et al. | 5,176,984 A | 1/1993 | Hipps, Sr. et al. |
| 4,663,641 A | 5/1987 | Iiyama et al. | 5,180,652 A | 1/1993 | Yamaguchi et al. |
| 4,698,291 A | 10/1987 | Koibuchi et al. | 5,185,236 A | 2/1993 | Shiba et al. |
| 4,701,402 A | 10/1987 | Patel et al. | 5,187,045 A | 2/1993 | Bonham et al. |
| 4,702,996 A | 10/1987 | Griffing et al. | 5,187,049 A | 2/1993 | Sher et al. |
| 4,707,430 A | 11/1987 | Ozawa et al. | 5,190,845 A | 3/1993 | Hashimoto et al. |
| 4,711,668 A | 12/1987 | Shimada et al. | 5,196,295 A | 3/1993 | Davis |
| 4,711,802 A | 12/1987 | Tannenbaum | 5,202,221 A | 4/1993 | Imai et al. |
| 4,713,113 A | 12/1987 | Shimada et al. | 5,208,136 A | 5/1993 | Zanoni et al. |
| 4,720,450 A | 1/1988 | Ellis | 5,219,703 A | 6/1993 | Bugner et al. |
| 4,721,734 A | 1/1988 | Gehlhaus et al. | 5,224,197 A | 6/1993 | Zanoni et al. |
| 4,724,021 A | 2/1988 | Martin et al. | 5,226,957 A | 7/1993 | Wickramanayake et al. |
| 4,724,201 A | 2/1988 | Okazaki et al. | 5,230,982 A | 7/1993 | Davis et al. |
| 4,725,527 A | 2/1988 | Robillard | 5,254,429 A | 10/1993 | Gracia et al. |
| 4,732,615 A | 3/1988 | Kawashita et al. | 5,258,274 A | 11/1993 | Helland et al. |
| 4,737,190 A | 4/1988 | Shimada et al. | 5,262,276 A | 11/1993 | Kawamura |
| 4,737,438 A | 4/1988 | Ito et al. | 5,275,646 A | 1/1994 | Marshall et al. |
| 4,740,451 A | 4/1988 | Kohara | 5,279,652 A | 1/1994 | Kaufmann et al. |
| 4,745,042 A | 5/1988 | Sasago et al. | 5,284,734 A | 2/1994 | Blum et al. |
| 4,755,450 A | 7/1988 | Sanders et al. | 5,296,275 A | 3/1994 | Goman et al. |
| 4,766,050 A | 8/1988 | Jerry | 5,300,403 A | 4/1994 | Angelopulos et al. |
| 4,766,055 A | 8/1988 | Kawabata et al. | 5,312,713 A | 5/1994 | Yokoyama et al. |
| 4,772,541 A | 9/1988 | Gottschalk | 5,312,721 A | 5/1994 | Gesign |
| 4,786,586 A | 11/1988 | Lee et al. | 5,330,860 A | 7/1994 | Grot et al. |
| 4,800,149 A | 1/1989 | Gottschalk | 5,334,455 A | 8/1994 | Noren et al. |
| 4,837,106 A | 6/1989 | Ishikawa et al. | 5,340,631 A | 8/1994 | Matsuzawa et al. |

| | | |
|---|---|---|
| 5,340,854 A | 8/1994 | Martic et al. |
| 5,344,483 A | 9/1994 | Hinton |
| 5,362,592 A | 11/1994 | Murofushi et al. |
| 5,362,916 A | 11/1994 | Edwards et al. |
| 5,366,947 A * | 11/1994 | Muller et al. ............. 502/112 |
| 5,376,503 A | 12/1994 | Audett et al. |
| 5,383,961 A | 1/1995 | Bauer et al. |
| 5,393,580 A | 2/1995 | Ma et al. |
| 5,415,976 A | 5/1995 | Ali |
| 5,426,164 A | 6/1995 | Babb et al. |
| 5,431,720 A | 7/1995 | Nagai et al. |
| 5,455,074 A | 10/1995 | Nohr et al. |
| 5,455,143 A | 10/1995 | Ali |
| 5,459,014 A | 10/1995 | Nishijima et al. |
| 5,466,283 A | 11/1995 | Kondo et al. |
| 5,476,540 A | 12/1995 | Shields et al. |
| 5,503,664 A | 4/1996 | Sano et al. |
| 5,532,112 A | 7/1996 | Kohler et al. |
| 5,597,405 A | 1/1997 | Grigoryan et al. |
| 5,685,754 A | 11/1997 | Nohr et al. |
| 5,709,955 A | 1/1998 | Nohr et al. |
| 5,721,287 A | 2/1998 | Nohr et al. |
| 5,739,175 A | 4/1998 | Nohr et al. |
| 5,747,550 A | 5/1998 | Nohr et al. |
| 5,795,985 A * | 8/1998 | Husler et al. ............. 544/106 |
| 5,798,015 A | 8/1998 | Nohr et al. |
| 5,811,199 A | 9/1998 | MacDonald et al. |
| 5,849,411 A | 12/1998 | Nohr et al. |
| 6,022,906 A | 2/2000 | Ohwa et al. |

FOREIGN PATENT DOCUMENTS

| | | |
|---|---|---|
| DE | 1154069 | 9/1963 |
| DE | 2052 198 A * | 10/1970 |
| DE | 2432563 | 2/1975 |
| DE | 2437380 | 2/1975 |
| DE | 2444520 | 3/1975 |
| DE | 2416259 | 10/1975 |
| DE | 2722264 | 11/1978 |
| DE | 3126433 | 1/1983 |
| DE | 3415033 | 10/1984 |
| DE | 3833437 | 4/1990 |
| DE | 3833438 | 4/1990 |
| DE | 4132288 | 4/1992 |
| EP | 0127574 | 12/1984 |
| EP | 0 209 831 | 1/1987 |
| EP | 0223587 | 5/1987 |
| EP | 0308274 | 3/1989 |
| EP | 0373662 | 6/1990 |
| EP | 0375160 | 6/1990 |
| EP | 0390439 | 10/1990 |
| EP | 0468465 | 1/1992 |
| EP | 0 475 075 | 3/1992 |
| EP | 0542286 | 5/1993 |
| EP | 0755984 | 1/1997 |
| EP | 0 805 152 | 11/1997 |
| EP | 0 861 880 | 9/1998 |
| GB | 355686 | 8/1931 |
| GB | 441085 | 1/1936 |
| GB | 463515 | 4/1937 |
| GB | 492711 | 9/1938 |
| GB | 518612 | 3/1940 |
| GB | 539912 | 9/1941 |
| GB | 626727 | 7/1947 |
| GB | 600451 | 4/1948 |
| GB | 616362 | 1/1949 |
| GB | 618616 | 2/1949 |
| GB | 779389 | 7/1957 |
| GB | 1150987 | 5/1969 |
| JP | 49-8909 | 2/1974 |
| JP | 5065592 | 6/1975 |
| JP | 51-17802 | 2/1976 |
| JP | 55-62059 | 5/1980 |
| JP | 55-90506 | 7/1980 |
| JP | 0014233 | 2/1981 |
| JP | 5761055 | 4/1982 |
| JP | 58-125770 | 7/1983 |
| JP | 5989360 | 5/1984 |
| JP | 60239739 | 11/1985 |
| JP | 60239740 | 11/1985 |
| JP | 60239741 | 11/1985 |
| JP | 60239743 | 11/1985 |
| JP | 613781 | 1/1986 |
| JP | 61-247703 | 11/1986 |
| JP | 627703 | 1/1987 |
| JP | 62127281 | 6/1987 |
| JP | 1-128063 | 5/1989 |
| JP | 2-58573 | 2/1990 |
| JP | 2179642 | 7/1990 |
| JP | 3-206439 | 9/1991 |
| JP | 4023884 | 1/1992 |
| JP | 4023885 | 1/1992 |
| JP | 04356087 | 12/1992 |
| JP | 543806 | 2/1993 |
| JP | 5080506 | 4/1993 |
| JP | 05119506 | 5/1993 |
| JP | 5263067 | 10/1993 |
| JP | 6214339 | 8/1994 |
| JP | 6256494 | 9/1994 |
| JP | 6256633 | 9/1994 |
| NL | 7113828 | 4/1972 |
| RU | 1310767 | 5/1987 |
| WO | WO 92/11295 | 7/1992 |
| WO | WO 94/01503 | 1/1994 |
| WO | WO 96/00740 | 1/1996 |
| WO | WO 96/19502 | 6/1996 |
| WO | WO 96/22335 | 7/1996 |
| WO | WO 96/24636 | 8/1996 |
| WO | WO 97/35933 | 10/1997 |

OTHER PUBLICATIONS

Abstract of patent, JP 06–43573 (Iku Meji) (Feb. 18, 1994).
Derwent World Patents JP 5186725 (Seiko Epson Corp.), Jul. 27, 1993. abstract.
Derwent Publications Ltd., London, JP 5–132638 (Mitsubishi Kasei Corp), May 28, 1993.
Derwent Publications Ltd., London, JP 5–125318 (Mitsubishi Kasei Corp), May 21, 1993.
Duxbury "The Photochemistry and Photophysics of Triphenylmethane Dyes in Solid Liquid Media" *Chemical Review* vol. 93 pp. 381–433 Jan. 1, 1993.
Derwent Publications Ltd., London, JP 4–189877 (Seiko Epson Corp), Jul. 8, 1992. (Abstract) Jul. 8, 1992.
Derwent Publications Ltd., London, JP 3167270 (Mitsubishi Kasei Corp), Jul. 19, 1991.
Derwent World Patents EP 435536 (Canon KK) Jul. 3, 1991. abstract Jul. 3, 1991.
Kogelschatz, "New Excimer UV Sources for Industrial Applications" *ABB Review* vol. 391 pp. 1–10 Mar. 1, 1991.
Braithwaite, M., et al. "Formulation" *Chemistry & Technology of UV & EB Formulation for Coatings, Inks & Paints* vol. IV pp. 11–12 Jan. 1, 1991.
*Scientific Polymer Products, Inc. Brochure* pp. 24–31 Jan. 1, 1991.
Dietliker, K. "Photoiniators for Free Radical and Cationic Polymerisation" *Chem & Tech of UV & EB Formulation for Coatings, Inks & Paints* vol. III pp. 61, 63, 229–23 Jan. 1, 1991.
"Coloring/Decoloring Agent for Tonor Use Developed" *Japan Chemical Week* Jan. 1, 1991.

Derwent Publications Ltd., London, JP 2091166 (Canon KK), Mar. 30, 1990. (Abstract).
Pappas, S.P. "Photocrosslinking" *Comph. Pol. Sci.* vol. 6 pp. 135–148 Jan. 1, 1989.
Pappas, S.P. "Photoinitiated Polymerization" *Comph. Pol. Sci.* vol. 4 pp. 337–355 Jan. 1, 1989.
Kirilenko, G.V. et al. "An analog of the vesicular process with amplitude modulation of the incident light beam" *Chemical Abstracts* vol. 111 pp. 569 Jan. 1, 1989.
Allen, Norman S. *Photopolymerisation and Photoimaging Science and Technology* pp. 188–19 Jan. 1, 1989.
Patent Abstracts of Japan, JP 63297477 (Fuji Photo Film Co. Ltd.) Dec. 5, 1988, abstract. Dec. 5, 1988.
Abstract of patent, JP 61–77846 Apr. 21, 1988.
Abstract of patent, JP 63–73241 Apr. 2, 1988.
Derwent World Patents JP 62064874 (Dainichiseika Color & Chem Mfg.), Mar. 23, 1987. abstract Mar. 23, 1987.
Abstract of patent, JP 62–32082 Feb. 12, 1987.
Gross et al. "Laser direct–write metallization in thin palladium acetate films" *J. App. Phys.* vol. 61 (4) pp. 1628–1632 Jan. 1, 1987.
Al–Ismail et al. "Some experimental results on thin polypropylene films loaded with finely–dispersed copper" *Journal of Materials Science* pp. 415–418 Jan. 1, 1987.
Abstract of patent, JP 61251842 Nov. 8, 1986.
Derwent Publications Ltd., London, DL 0234731 (Karl Marx Univ. Leipzig), Apr. 9, 1986. (Abstract).
Derwent World Patents Index, SU 1219612 (AS USSR NON–AQ SOLN) Mar. 23, 1986.
Dialog, JAPIO, JP 61–034057 (Ciba Geigy AG) Feb. 18, 1986.
Derwent World Patents Index, EP 127574 (Ciba Geigy AG), Dec. 5, 1984.
Derwent Publications Ltd., London, JP 0198187 (Canon KK), Nov. 9, 1984. (Abstract).
van Beek, H.C.A. "Light–Induced Colour Changes in Dyes and Materials" *Color Res. and Appl.* vol 8 pp. 176–181 Jan. 1, 1983.
Fischer, "Submicroscopic contact imaging with visible light by energy transfer" *Appl. Phys. Letter* vol. 40(3) Feb. 1, 1982.
Patent Abstracts of Japan, JP 56143274 (Canon Inc.) Nov. 7, 1981, abstract.

Derwent Publications Ltd., London, J,A, 0008135 (Ricoh KK), Jan. 27, 1981. (Abstract)
Komiyama et al. "One–Pot Preparation of 4–Hydroxychalcone β–Cyclodextrin as Catalyst," *Makromol. Chem.* vol. 2 pp. 733–734 Jan. 1, 1981.
Derwent Publications Ltd., London, J,A. 0005422 (Fuji Photo Film KK), Jan. 16, 1979.
Drexhage et al. "Photo–bleachable dyes and processes" *Research Disclosure* pp. 85–87 Jan. 1, 1979.
"Color imaging devices and color filter arrays using photo–bleachable dyes" *Research Disclosure* pp. 22–23 Jan. 1, 1979.
Jenkins, P.W. et al. "Photobleachable dye material" *Research Disclosure* p. 18 [No. 12932] Jan. 1, 1975.
Lamberts, R.L. "Recording color grid patterns with lenticules" *Research Disclosure* pp. 18–19 Jan. 1, 1975.
"Variable Contrast Printing System" *Research Disclosure* p. 19 [No. 2931] Jan. 1, 1975.
Chang, I.F., et al. "Color Modulated Dye Ink Jet Printer" *IBM Technical Disclosure Bulletin* vol. 17(5) pp. 1520–1521 Oct. 1, 1974.
"Darocur 1173: Liquid Photoiniator for Ultraviolet Curing of Coatings" Jan. 1, 1974.
Tsuda, K., et al. Vinyl Polymerization. CXLVI. The influence of dibenzoyl disulfide derivatives on radical polymerizations *Chemcial Abstract* vol. 1966:29198 Jan. 1, 1966.
R.T. Morrison & R.N. Boyd *Organic Chemistry* p. 174 Jan. 1, 1959.
Chatterjee, S. et al. "Photochemistry of Carbocyanine Alkyltriphenylborate Salts: Intra–Ion–Pair Electron Transfer and the Chemistry of Boranyl Radicals" *J. Am. Chem. Soc.* vol. 112 pp. 6329–6338.
"Monomers" *Scientific Polymer Products Inc.*
Yamaguchi, H. et al. "Supersensitization. Aromatic ketones as supersensitizers" *Chemical Abstracts* vol. 53 p. 107 (d).
Stecher, H. "Ultraviolet–absorptive additives in adhesives, lacquers and plastics" *Chemical Abstracts* vol. 53 p. 14579 (c).
Derwent Publications Ltd., London, 4 9128022.

\* cited by examiner

ZINC-COMPLEX PHOTOINITIATORS AND APPLICATIONS THEREFOR

PRIOR RELATED U.S. APPLICATION DATA

This application claims priority to U.S. provisional application Ser. No. 60/212,428, filed Jun. 19, 2000.

TECHNICAL FIELD

The present invention relates to novel photoinitiators and methods for generating a reactive species using the photoinitiators. The present invention further relates to methods of polymerizing or photocuring polymerizable material using the above-mentioned photoinitiators. The photoinitiators of the present invention find particular utility in photocurable inks as used in ink jet printers or on a printing press with and without nitrogen blanketing.

BACKGROUND OF THE INVENTION

Polymers have served essential needs in society. For many years, these needs were filled by natural polymers. More recently, synthetic polymers have played an increasingly greater role, particularly since the beginning of the 20th century. Especially useful polymers are those prepared by an addition polymerization mechanism, i.e., free radical chain polymerization of unsaturated monomers, and include, by way of example only, coatings and adhesives. In fact, the majority of commercially significant processes are based on free-radical chemistry. That is, chain polymerization is initiated by a reactive species, which often is a free radical. The source of the free radicals is termed an initiator or photoinitiator.

Improvements in free radical chain polymerization have focused both on (1) more reactive monomer and prepolymer materials and (2) the photoinitiator. Whether a particular unsaturated monomer can be converted to a polymer requires structural, thermodynamic, and kinetic feasibility. Even when all three exist, kinetic feasibility is achieved in many cases only with a specific type of photoinitiator. Moreover, the photoinitiator can have a significant effect on reaction rate which, in turn, may determine the commercial success or failure of a particular polymerization process or product.

A free radical-generating photoinitiator may generate free radicals in several different ways. For example, the thermal, homolytic dissociation of an initiator typically directly yields two free radicals per initiator molecule. A photoinitiator, i.e., an initiator which absorbs light energy, may produce free radicals by one of three pathways:

(1) the photoinitiator undergoes excitation by energy absorption with subsequent decomposition into one or more radicals;

(2) the photoinitiator undergoes excitation and the excited species interacts with a second compound (by either energy transfer or a redox reaction) to form free radicals from the latter and/or former compound(s); or (3) the photoinitiator undergoes an electron transfer to produce a radical cation and a radical anion.

While any free radical chain polymerization process should avoid the presence of species which may prematurely terminate the polymerization reaction, prior photoinitiators present special problems. For example, absorption of the light by the reaction medium may limit the amount of energy available for absorption by the photoinitiator. Also, the often competitive and complex kinetics involved may have an adverse effect on the reaction rate. Moreover, some commercially available radiation sources, such as medium and high pressure mercury and xenon lamps, may emit over a wide wavelength range, thus producing individual emission bands of relatively low intensity. Many photoinitiators only absorb over a small portion of the emission spectra and, as a consequence, much of the lamps' radiation remains unused. In addition, most known photoinitiators have only moderate "quantum yields" (generally less than 0.4) at these wavelengths, indicating that the conversion of light radiation to radical formation can be more efficient.

Many commercially available photoinitiators, including IRGACURE® 369, are presently used in ink compositions to accelerate ink drying in "radiation-drying printing." As used herein, the term "radiation-drying printing" refers to any printing method which utilizes radiation as a drying means. Radiation-drying printing includes, for example, off-set printing operations, such as on a Heidelberg press, flexographic printing, and flat-bed printing. Commercially available photoinitiator systems have a number of shortcomings. First, most of the commercially available photoinitiator systems require a relatively large amount of photoinitiator in the ink composition to fully cure/dry the ink composition. This leads to undesirable extractables within the ink composition. Second, most of the commercially available photoinitiator systems require a high energy radiation source to induce photocuring. Moreover, even with the high energy radiation source, often the cure results are unsatisfactory. Third, many commercially available photoinitiator systems are highly reactive to oxygen and must be used under a nitrogen blanket. Fourth, even with a large amount of photoinitiator and a high energy light source, the commercially available photoinitiator systems require a dry/cure time only accomplished by multiple passes, as many as 15 passes, under a light source, which significantly limits the output of a radiation-drying printing press.

What is needed in the art is a new class of energy-efficient photoinitiators having unsurpassed photoreactivity even when exposed to a low energy light source, such as a 50 W excimer cold lamp. What is also needed in the art is a new class of energy-efficient photoinitiators that may be cured in air, as well as, a nitrogen atmosphere. Further, what is needed in the art is a class of photoinitiators having unsurpassed photoreactivity, for use in the radiation-drying printing industry, which will significantly increase the output of a radiation-drying printing press due to reduction in ink drying/curing time.

SUMMARY OF THE INVENTION

The present invention addresses some of the difficulties and problems discussed above by the discovery of energy-efficient photoinitiators having the following general formula:

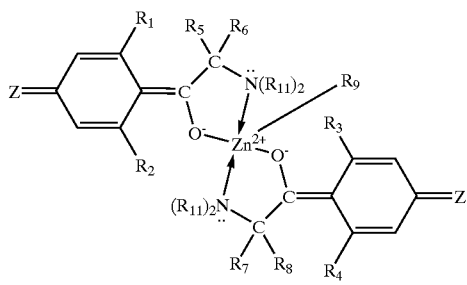

wherein Z each independently represents

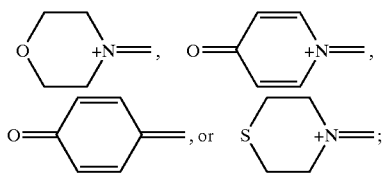

wherein $R_1$, $R_2$, $R_3$ and $R_4$ each independently represent hydrogen, an alkyl group having from one to six carbon atoms, an alkoxy group having from one to six carbon atoms, or a halogen-substituted alkyl group; $R_5$, $R_6$, $R_7$ and $R_8$ each independently represent an alkyl group having from one to six carbon atoms, an aryl group, or a halogen-substituted alkyl group having from one to six carbon atoms; wherein $R_9$ represents $(R_{10})_2O$ or $(R_{10})_3N$; wherein $R_{10}$ represents H or an alkyl group having from one to eight carbon atoms; and wherein $R_{11}$, represents H, an alkyl group having from one to eight carbon atoms, a benzyl group or an aralkyl group. By selecting particular "R" groups, photoinitiators are produced having a desired absorption maximum, which substantially corresponds to an emission band of a radiation source and selectively varies from less than about 290 nm to greater than about 350 nm.

The present invention is directed to the above-described photoinitiators, compositions containing the same, and methods for generating a reactive species which includes providing one or more of the photoinitiators and irradiating the one or more photoinitiators. One of the main advantages of the photoinitiators of the present invention is that they efficiently generate one or more reactive species under extremely low energy lamps, such as excimer lamps and mercury lamps, as compared to prior art photoinitiators. The photoinitiators of the present invention also efficiently generate one or more reactive species in air or in a nitrogen atmosphere. Unlike many prior photoinitiators, the photoinitiators of the present invention are not sensitive to oxygen. Further, the photoinitiators of the present invention are as much as ten times faster than the best prior art photoinitiators.

The present invention is further directed to a method of efficiently generating a reactive species by matching a photoinitiator having an absorption maximum to an emission band of a radiation source, which corresponds to the absorption maximum. By adjusting the substituents of the photoinitiator, one can shift the absorption maximum of the photoinitiator from less than about 290 nm to greater than about 350 nm.

The present invention is also directed to methods of using the above-described photoinitiators to polymerize and/or photocure a polymerizable material. The photoinitiators of the present invention result in rapid curing times in comparison to the curing times of prior art photoinitiators, even with relatively low output lamps. The present invention includes a method of polymerizing a polymerizable material by exposing the polymerizable material to radiation in the presence of the efficacious wavelength specific photoinitiator composition described above. When an unsaturated oligomer/monomer mixture is employed, curing is accomplished.

The present invention further includes a film and a method for producing a film, by drawing an admixture of polymerizable material and one or more photoinitiators of the present invention, into a film and irradiating the film with an amount of radiation sufficient to polymerize the composition. The admixture may be drawn into a film on a nonwoven web or on a fiber, thereby providing a polymer-coated nonwoven web or fiber, and a method for producing the same.

The present invention is also directed to an adhesive composition comprising a polymerizable material admixed with one or more photoinitiators of the present invention. Similarly, the present invention includes a laminated structure comprising at least two layers bonded together with the above-described adhesive composition, in which at least one layer is a nonwoven web or film. Accordingly, the present invention provides a method of laminating a structure wherein a structure having at least two layers with the above-described adhesive composition between the layers is irradiated to polymerize the adhesive composition.

The present invention is further directed to a method of printing, wherein the method comprises incorporating one or more photoinitiators of the present invention into an ink composition; printing the ink onto a substrate; and drying the ink with a source of radiation.

These and other features and advantages of the present invention will become apparent after a review of the following detailed description of the disclosed embodiments and the appended claims.

DETAILED DESCRIPTION OF THE INVENTION

The present invention is directed to energy-efficient, reactive, photoinitiators and methods for utilizing the same. More particularly, the present invention is directed to new photoinitiators having the following general formula:

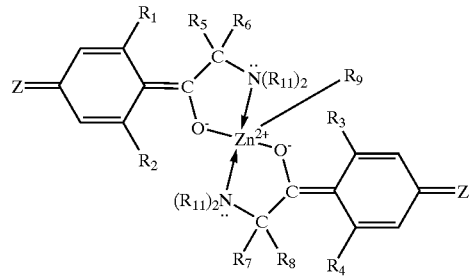

wherein Z each independently represents

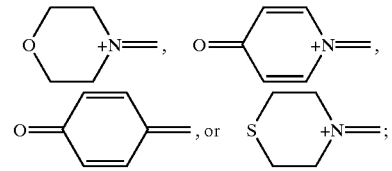

wherein $R_1$, $R_2$, $R_3$ and $R_4$ each independently represent hydrogen, an alkyl group having from one to six carbon atoms, an alkoxy group having from one to six carbon atoms, or a halogen-substituted alkyl group; $R_5$, $R_6$, $R_7$ and $R_8$ each independently represent an alkyl group having from one to six carbon atoms, an aryl group, or a halogen-substituted alkyl group having from one to six carbon atoms; wherein $R_9$ represents $(R_{10})_2O$ or $(R_{10})_3N$; wherein $R_{10}$ represents H or an alkyl group having from one to eight carbon atoms; and wherein $R_{11}$, represents H, an alkyl group having from one to eight carbon atoms, a benzyl group or an aralkyl group.

The present invention is further directed to a method of efficiently generating a reactive species by matching a photoinitiator having an absorption maximum to an emission band of a radiation source, which corresponds to the absorption maximum. The present invention also includes a method of polymerizing a polymerizable material by exposing the polymerizable material to electromagnetic radiation in the presence of one or more of the photoinitiators described above. Further, the present invention is directed to a film and a method for producing a film, by drawing an admixture of polymerizable material and one or more of the photoinitiators described above, into a film and irradiating the film with an amount of electromagnetic radiation sufficient to polymerize the admixture.

The present invention is further directed to an adhesive composition comprising a polymerizable material admixed and one or more photoinitiators of the present invention. Similarly, the present invention includes a laminated structure comprising at least two layers bonded together with the above-described adhesive composition. The present invention further provides a method of laminating a structure wherein a structure having at least two layers with the above-described adhesive composition between the layers is irradiated with appropriate electromagnetic radiation to polymerize the adhesive composition.

Definitions

As used herein, the term "reactive species" is used herein to mean any chemically reactive species including, but not limited to, free-radicals, cations, anions, nitrenes, and carbenes. Illustrated below are examples of several of such species. Examples of carbenes include, for example, methylene or carbene, dichlorocarbene, diphenylcarbene, alkylcarbonyl-carbenes, siloxycarbenes, and dicarbenes. Examples of nitrenes include, also by way of example, nitrene, alkyl nitrenes, and aryl nitrenes. Cations (sometimes referred to as carbocations or carbonium ions) include, by way of illustration, a proton; primary, secondary, and tertiary alkyl carbocations, such as methyl cation, ethyl cation, propyl cation, t-butyl cation, t-pentyl cation, t-hexyl cation; allylic cations; benzylic cations; aryl cations, such as triphenyl cation; cyclopropylmethyl cations; methoxymethyl cation; triarylsulphonium cations; and acyl cations. Cations also include those formed from various metal salts, such as tetra-n-butylammonium tetrahaloaurate(III) salts; sodium tetrachloroaurate(III); vanadium tetrachloride; and silver, copper(I) and (II), and thallium(I) triflates. Examples of anions (sometimes referred to as carbanions) include, by way of example, alkyl anions, such as ethyl anion, n-propyl anion, isobutyl anion, and neopentyl anion; cycloalkyl anions, such as cyclopropyl anion, cyclobutyl anion, and cyclopentyl anion; allylic anions; benzylic anions; aryl cations; and sulfur- or phosphorus-containing alkyl anions. Finally, examples of organometallic photoinitiators include titanocenes, fluorinated diaryltitanocenes, iron arene complexes, manganese decacarbonyl, and methylcyclopentadienyl manganese tricarbonyl. Organometallic photoinitiators generally produce free radicals or cations.

As used herein, the term "quantum yield" is used herein to indicate the efficiency of a photochemical process. More particularly quantum yield is a measure of the probability that a particular molecule will absorb a quantum of light during its interaction with a photon. The term expresses the number of photochemical events per photon absorbed. Thus, quantum yields may vary from zero (no absorption) to 1.

As used herein, the term "polymerization" is used herein to mean the combining, e.g. covalent bonding, of a number of smaller molecules, such as monomers, to form large molecules, i.e., macromolecules or polymers. The monomers may be combined to form only linear macromolecules or they may be combined to form three-dimensional macromolecules, commonly referred to as crosslinked polymers.

As used herein, the term "curing" means the polymerization of functional oligomers and monomers, or even polymers, into a crosslinked polymer network. Thus, curing is the polymerization of unsaturated monomers or oligomers in the presence of crosslinking agents.

As used herein, the terms "unsaturated monomer," "functional oligomer," and "crosslinking agent" are used herein with their usual meanings and are well understood by those having ordinary skill in the art. The singular form of each is intended to include both the singular and the plural, i.e., one or more of each respective material.

As used herein, the term "unsaturated polymerizable material" is meant to include any unsaturated material capable of undergoing polymerization. The term encompasses unsaturated monomers, oligomers, and crosslinking agents. Again, the singular form of the term is intended to include both the singular and the plural.

As used herein, the term "fiber" as used herein denotes a threadlike structure. The fibers used in the present invention may be any fibers known in the art. As used herein, the term "nonwoven web" as used herein denotes a web-like matter comprised of one or more overlapping or interconnected fibers in a nonwoven manner. It is to be understood that any nonwoven fibers known in the art may be used in the present invention.

Photoinitiators

The present invention is directed to new photoinitiators having the following general formula:

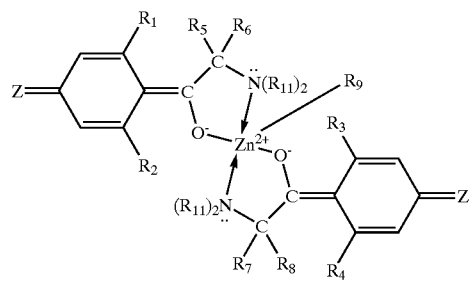

wherein Z each independently represents

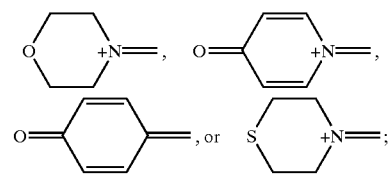

wherein $R_1$, $R_2$, $R_3$ and $R_4$ each independently represent hydrogen, an alkyl group having from one to six carbon atoms, an alkoxy group having from one to six carbon atoms, or a halogen-substituted alkyl group; $R_5$, $R_6$, $R_7$ and $R_8$ each independently represent an alkyl group having from one to six carbon atoms, an aryl group, or a halogen-substituted alkyl group having from one to six carbon atoms; wherein $R_9$ represents $(R_{10})_2O$ or $(R_{10})_3N$; wherein $R_{10}$ represents H or an alkyl group having from one to eight carbon atoms; and wherein $R_{11}$ represents H, an alkyl group having from one to eight carbon atoms, a benzyl group or an aralkyl group.

Photoinitiators having the above formula include, but are not limited to, the following photoinitiators:

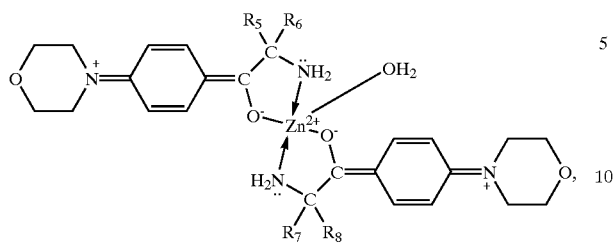

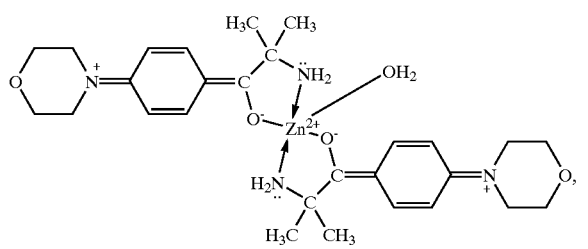

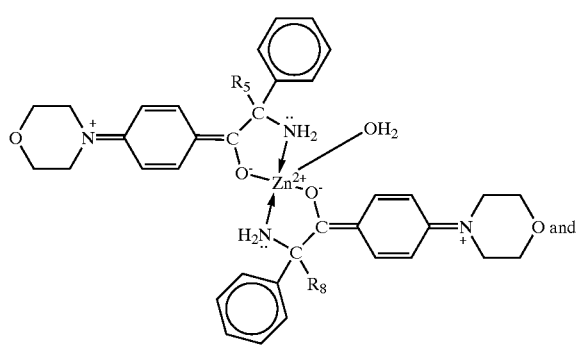

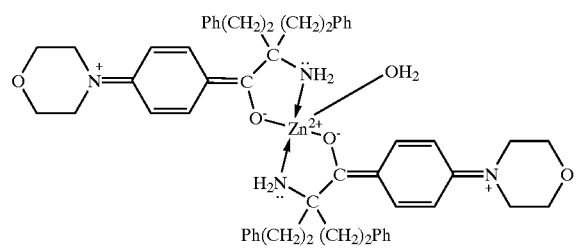

wherein $R_5$, $R_6$, $R_7$, $R_8$ and $R_9$ are as described above.

The photoinitiators of the present invention may be associated with a variety of counterions. Suitable counterions possess a negative charge distribution, which is spread over a large anion, resulting in a diffused charge rather than a point charge. Examples of suitable counterions include, but are not limited to, tetraphenylboron, tetrachloroboron, tetrafluoroboron, hexafluorophosphate, and perchlorate. Desirably, the counterion comprises tetraphenylboron or tetrafluoroboron. More desirably, the counterion comprises tetrafluoroboron.

In one embodiment of the present invention, a photoinitiator system comprises the following photoinitiator and counterions:

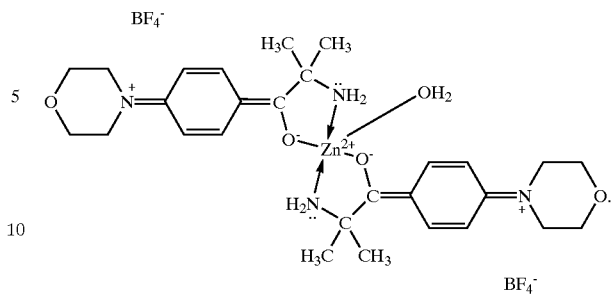

The above-described photoinitiators of the present invention may be produced by the following reaction mechanism, shown for when $R_{11}$ is hydrogen and Z is $NC_4H_4O$:

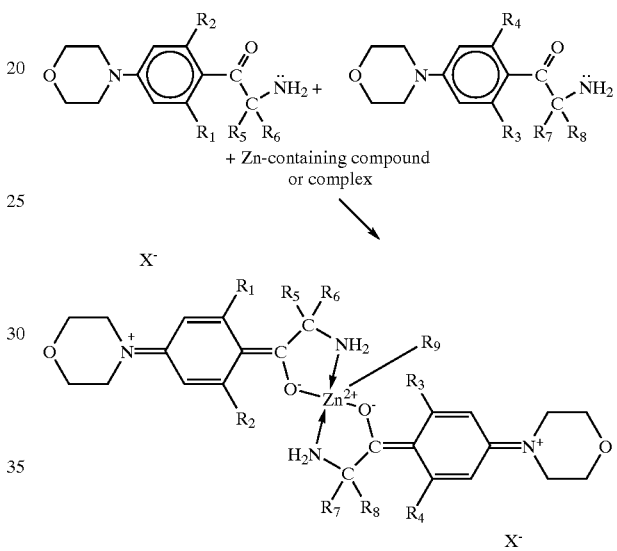

wherein one or more compounds react with the Zn-containing compound or complex to produce a photoinitiator of the present invention and one or more anions ($X^-$). Suitable Zn-containing compounds or complexes include, but are not limited to, $Zn(OEt_2)_2Cl_2$, $Zn(H_2O)_6(BF_4)_2$, and $Zn(H_2O)_6(BPh_4)_2$. In the above mechanism, the use of a particular Zn-containing compound or complex results in a particular $R_9$ group and anions as shown in the table below:

| Zn-containing Compound or Complex | Resulting $R_9$ Group | Resulting Anions |
|---|---|---|
| $Zn(OEt_2)_2Cl_2$ | $OEt_2$ | $Cl^-$ |
| $Zn(H_2O)_6(BF_4)_2$ | $H_2O$ | $BF_4^-$ |
| $Zn(H_2O)_6(BPh_4)_2$ | $H_2O$ | $BPh_4^-$ |

It should be understood that the above examples of suitable photoinitiators are only a few of the possible photoinitiators encompassed by the present invention. Any combination of photoinitiator having selected "R" groups and any of the above-mentioned counterions may be used in combination to form a photoinitiator system of the present invention. Further, the above reaction mechanism is only one example of many possible reaction mechanisms, which may include a variety of reactants, resulting in the photoinitiators of the present invention.

The resulting photoinitiators are relatively stable at room temperature (from about 15° C. to 25° C.) and normal room humidity (from about 5% to 60%; desirably from 5% to 30%). However, upon exposure to radiation at an appropriate wavelength, the photoinitiators efficiently produce one or more reactive species. The photoinitiators of the present invention have a high intensity of absorption. For example, the photoinitiators of the present invention have a molar extinction coefficient (absorptivity) greater than about 20,000 1 $\text{mole}^{-1}$ $\text{cm}^{-1}$. As a further example, the photoinitiators of the present invention have a molar extinction coefficient greater than about 25,000 1 $\text{mole}^{-1}$ $\text{cm}^{-1}$.

Method of Generating a Reactive Species and Applications Therefor

The present invention is further directed to a method of generating a reactive species. The method of generating a reactive species involves generating a reactive species by exposing one or more of the above-described photoinitiators to radiation. The exposure of the photoinitiators to a radiation source triggers a photochemical process. As stated above, the term "quantum yield" is used herein to indicate the efficiency of a photochemical process. More particularly, quantum yield is a measure of the probability that a particular molecule (photoinitiator) will absorb a quantum of light during its interaction with a photon. The term expresses the number of photochemical events per photon absorbed. Thus, quantum yields may vary from zero (no absorption) to 1.

The photoinitiators of the present invention absorb photons having a relatively specific wavelength and transfers the absorbed energy to one or more excitable portions of the molecule. The excitable portion of the molecule absorbs enough energy to cause a bond breakage, which generates one or more reactive species. The efficiency with which a reactive species is generated with the photoinitiators of the present invention is significantly greater than that experienced with photoinitiators of the prior art as indicated by faster cure times. For example, the photoinitiators of the present invention desirably will have a quantum yield greater than about 0.8. More desirably, the quantum yield of the photoinitiators of the present invention will be greater than about 0.9. Even more desirably, the quantum yield of the photoinitiators of the present invention will be greater than about 0.95. Still more desirably, the quantum yield of the photoinitiators of the present invention will be greater than about 0.99, with the most desirable quantum yield being about 10.

In one embodiment of the present invention, the photoinitiators of the present invention are exposed to radiation at a desired wavelength, resulting in the generation of one or more reactive species, wherein an electron-donating solvent is used to generate one or more reactive species. Any solvent capable of donating an electron to the photoinitiators of the present invention may be used to generate one or more reactive species. Suitable electron-donating solvents include, but are not limited to, acrylates, methacylates, vinyl esters, enamines, and a combination thereof. Desirably, the electron-donating solvent comprises acrylic acid.

It is believed that the interaction between the photoinitiator of the present invention and the electron-donating solvent takes place as shown by the following reaction mechanism:

Donation of Electron

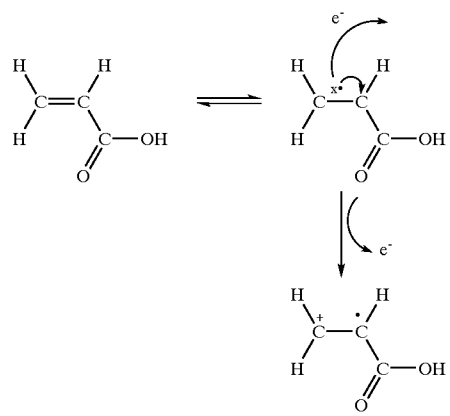

As shown above, donation of an electron from the electron-donating solvent generates a cationic free radical.

Electron Interaction With Photoinitiator:

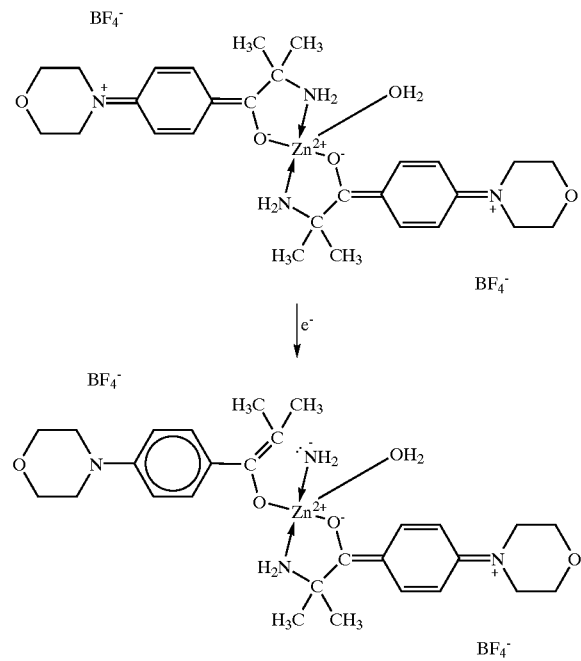

The introduction of the electron into the structure of the photoinitiator results in the formation of a carbon-carbon double bond and cleavage of the carbon-nitrogen bond. The end result is a nitrogen-containing free radical.

The above mechanism generates a combination of free radicals, one of which is a cationic free radical and one of which is nitrogen radical species. In conventional electron transfer systems, an initiator generates a radical cation, which starts the polymerization process, and a radical anion, which is a chain terminator (i.e., stops polymerization). However, the method of generating a reactive species of the present invention generates a radical cation and a nitrogen radical species, both of which start the polymerization process, and neither of which act as a chain terminator (i.e., stop polymerization).

Exposing the photoinitiators of the present invention to radiation results in the generation of one or more reactive species as discussed above. Thus, the photoinitiators may be employed in any situation where reactive species are required, such as for the polymerization of an unsaturated monomer and the curing of an unsaturated oligomer/monomer mixture. The unsaturated monomers and oligomers may be any of those known to one having ordinary skill in the art. In addition, the polymerization and curing media also may contain other materials as desired, such as pigments, extenders, amine synergists, and such other additives as are well known to those having ordinary skill in the art.

By way of illustration only, examples of unsaturated monomers and oligomers include ethylene, propylene, vinyl chloride, isobutylene, styrene, isoprene, acrylonitrile, acrylic acid, methacylic acid, ethyl acrylate, methyl methacrylate, vinyl acrylate, allyl methacrylate, tripropylene glycol diacrylate, trimethylol propane ethoxylate acrylate, epoxy acrylates, such as the reaction product of a bisphenol A epoxide with acrylic acid; polyether acrylates, such as the reaction product of acrylic acid with an adipic acid/hexanediol-based polyether, urethane acrylates, such as the reaction product of hydroxypropyl acrylate with diphenylmethane-4,4'-diisocyanate, and polybutadiene diacrylate oligomer.

The types of reactions that various reactive species enter into include, but are not limited to, addition reactions, including polymerization reactions; abstraction reactions; rearrangement reactions; elimination reactions, including decarboxylation reactions; oxidation-reduction (redox) reactions; substitution reactions; and conjugation/deconjugation reactions.

Accordingly, the present invention also comprehends a method of polymerizing a polymerizable material, such as an unsaturated monomer or epoxy compound, by exposing the polymerizable material to radiation in the presence of the effacious photoinitiators of the present invention described herein. When an unsaturated oligomer/monomer mixture is employed in place of an unsaturated monomer, curing is accomplished. It is to be understood that the polymerizable material admixed with the photoinitiators of the present invention is to be admixed by means known in the art, and that the mixture will be irradiated with an amount of radiation sufficient to polymerize the material. The amount of radiation sufficient to polymerize the material is readily determinable by one of ordinary skill in the art, and depends upon the identity and amount of photoinitiators, the identity and amount of the polymerizable material, the intensity and wavelength of the radiation, and the duration of exposure to the radiation.

Polymer Films, Coated Fibers and Webs, and Adhesive Compositions

The present invention further includes a film and a method for producing a film, by drawing an admixture of a polymerizable material and one or more photoinitiators of the present invention, into a film and irradiating the film with an amount of radiation sufficient to polymerize the composition. When the polymerizable material is an unsaturated oligomer/monomer mixture, curing is accomplished. Any film thickness may be produced, as per the thickness of the admixture formed, so long as the admixture sufficiently polymerizes upon exposure to radiation. The admixture may be drawn into a film on a nonwoven web or on a fiber, thereby providing a polymer-coated nonwoven web or fiber, and a method for producing the same. Any method known in the art of drawing the admixture into a film may be used in the present invention. The amount of radiation sufficient to polymerize the material is readily determinable by one of ordinary skill in the art, and depends upon the identity and amount of photoinitiator, the identity and amount of the polymerizable material, the thickness of the admixture, the intensity and wavelength of the radiation, and duration of exposure to the radiation.

The present invention is further directed to coatings comprising a polymerizable material admixed with one or more photoinitiators of the present invention. The coatings may be applied to a substrate and then exposed to an amount of radiation sufficient to polymerize the polymerizable material of the coating. Any substrate may be used in the practice of the present invention. Particular applications of interest include, but are not limited to, coatings on textiles, coatings on fabrics, coatings on textile fibers, and coatings on optical fibers.

The present invention also includes an adhesive composition comprising a polymerizable material admixed with one or more photoinitiators of the present invention. Similarly, the present invention includes a laminated structure comprising at least two layers bonded together with the above-described adhesive composition. In one embodiment of the present invention, a laminate is produced wherein at least one layer is a cellulosic or polyolefin nonwoven web or film. Accordingly, the present invention provides a method of laminating a structure wherein a structure having at least two layers with the above-described adhesive composition between the layers is irradiated to polymerize the adhesive composition. When the unsaturated polymerizable material in the adhesive is an unsaturated oligomer/monomer mixture, the adhesive is irradiated to cure the composition.

It is to be understood that any layers may be used in the laminates of the present invention, on the condition that at least one of the layers allows sufficient radiation to penetrate through the layer to enable the admixture to polymerize sufficiently. Accordingly, any cellulosic or polyolefin nonwoven web or film known in the art may be used as one of the layers so long as they allow radiation to pass through. Again, the amount of radiation sufficient to polymerize the admixture is readily determinable by one of ordinary skill in the art, and depends upon the identity and amount of photoinitiator, the identity and amount of the polymerizable material, the thickness of the admixture, the identity and thickness of the layer, the intensity and wavelength of the radiation, and the duration of exposure to the radiation.

The radiation to which the photoinitiators of the present invention may be exposed generally will have a wavelength of from about 4 to about 1,000 nanometers. Thus, the radiation may be ultraviolet radiation, including near ultraviolet and far or vacuum ultraviolet radiation; visible radiation; and near infrared radiation. Desirably, the radiation will have a wavelength of from about 100 to about 900 nanometers. More desirably, the radiation will have a wavelength of from about 100 to 700 nanometers. Desirably, the radiation will be ultraviolet radiation having a wavelength of from about 4 to about 400 nanometers. More desirably, the radiation will have a wavelength of from about 100 to about 420 nanometers, and even more desirably will have a wavelength of from 290 to about 320 nanometers. The radiation desirably will be incoherent, pulsed ultraviolet radiation from a dielectric barrier discharge excimer lamp or radiation from a mercury lamp.

Excimers are unstable excited-state molecular complexes which occur only under extreme conditions, such as those temporarily existing in special types of gas discharge. Typical examples are the molecular bonds between two rare gaseous atoms or between a rare gas atom and a halogen atom. Excimer complexes dissociate within less than a microsecond and, while they are dissociating, release their binding energy in the form of ultraviolet radiation. The dielectric barrier excimers in general emit in the range of from about 125 nm to about 500 nm, depending upon the excimer gas mixture.

Dielectric barrier discharge excimer lamps (also referred to hereinafter as "excimer lamp") are described, for example, by U. Kogelschatz, "Silent discharges for the generation of ultraviolet and vacuum ultraviolet excimer radiation." Pure & Appl. Chem., 62, No. 9, pp. 16671674 (1990); and E. Eliasson and U. Kogelschatz, "UV Excimer Radiation from Dielectric- Barrier Discharges." Appl. Phys. B. 46, pp. 299–303 (1988). Excimer lamps were developed by ABB Infocom Ltd., Lenzburg, Switzerland, and at the present time are available from Heraeus Noblelight GmbH, Kleinostheim, Germany.

The excimer lamp emits incoherent, pulsed ultraviolet radiation. Such radiation has a relatively narrow bandwidth, i.e., the half width is of the order of approximately 5 to 100 nanometers. Desirably, the radiation will have a half width of the order of approximately 5 to 50 nanometers, and more desirably will have a half width of the order of 5 to 25 nanometers. Most desirably, the half width will be of the order of approximately 5 to 15 nanometers.

The ultraviolet radiation emitted from an excimer lamp can be emitted in a plurality of wavelengths, wherein one or more of the wavelengths within the band are emitted at a maximum intensity. Accordingly, a plot of the wavelengths in the band against the intensity for each wavelength in the band produces a bell curve. The "half width" of the range of ultraviolet radiation emitted by an excimer lamp is defined as the width of the bell curve at 50% of the maximum height of the bell curve.

The emitted radiation of an excimer lamp is incoherent and pulsed, the frequency of the pulses being dependent upon the frequency of the alternating current power supply which typically is in the range of from about 20 to about 300 kHz. An excimer lamp typically is identified or referred to by the wavelength at which the maximum intensity of the radiation occurs, which convention is followed throughout this specification and the claims. Thus, in comparison with most other commercially useful sources of ultraviolet radiation which typically emit over the entire ultraviolet spectrum and even into the visible region, excimer lamp radiation is essentially monochromatic.

Although excimer lamps are highly desirable for use in the present invention, the source of radiation used with the photoinitiators of the present invention may be any radiation source known to those of ordinary skill in the art. In a further embodiment of the present invention, a mercury lamp with a D-bulb, which produces radiation having an emission peak of about 360 nm is used to produce free radicals from the above-described photoinitiators. This radiation source is particularly useful when matched with one or more photoinitiators of the present invention having an absorption maximum of about 360 nanometers, corresponding to the emission peak of the mercury lamp. Other specialty doped lamps, which emit radiation at about 420 nm, may be used with photoinitiators of the present invention which have an absorption maximum at about 420 nm. One lamp, the V-bulb available from Fusion Systems, is another suitable lamp for use in the present invention. In addition, specialty lamps having a specific emission band may be manufactured for use with one or more specific photoinitiators of the present invention. New lamp technology provides the following potential advantages:

(a) substantially single wavelength output;
(b) unique wavelength output;
(c) high intensity; and
(d) absence of radiation trapping.

As a result of the photoinitiators of the present invention absorbing radiation in the range of about 250 to about 390 nanometers, some of the photoinitiators of the present invention will generate one or more reactive species upon exposure to sunlight. Accordingly, these photoinitiators of the present invention provides a method for the generation of reactive species that does not require the presence of a special light source.

The photoinitiators of the present invention enable the production of adhesive and coating compositions that consumers can apply to a desired object and polymerize or cure upon exposure to sunlight. These photoinitiators also enable numerous industry applications wherein polymerizable materials may be polymerized merely upon exposure to sunlight. Therefore, depending upon how the photoinitiator is designed, the photoinitiator of the present invention can eliminate the cost of purchasing and maintaining light sources in numerous industries wherein such light sources are necessary without the photoinitiators of the present invention.

The effective tuning of the photoinitiators of the present invention for a specific wavelength band permits the photoinitiators of the present invention to more efficiently utilize the target radiation in the emission spectrum of the radiating source corresponding to the "tuned" wavelength band, even though the intensity of such radiation may be much lower than, for example, radiation from a narrow band emitter, such as an excimer lamp. For example, it may be desirable to utilize an excimer lamp, or other radiation emission source, that emits radiation having a wavelength of approximately 360 nm or 420 nm with the photoinitiators of the present invention. However, the effectiveness of the photoinitiators of the present invention is not necessarily dependent upon the availability or use of a narrow wavelength band radiation source.

Use of the Above-Described Photoinitiators in an Ink Composition

The above-described photoinitiators of the present invention may be incorporated into ink compositions. In one embodiment of the present invention, one or more of the photoinitiators are incorporated into an ink jet ink composition for use on ink jet ink printers. The ink composition may be used on commercially available ink jet printing machines alone or in combination with a radiation source in series with the ink jet printing machine for instantaneous curing of the ink jet ink composition. Any radiation source known to those of ordinary skill in the art may be used to cure the ink jet ink composition. Desirably, one of the above-described radiation sources is used to cure the ink composition.

Use of the Above-Described Photoinitiators in Other Radiation-Drying Printing Process A further use of the above-described photoinitiators of the present invention involves the incorporation of one or more of the photoinitiators into an ink composition for use on a radiation-drying printing press. As discussed above, "radiation-drying printing" refers to any printing method which utilizes radiation as a drying means. Radiation-drying printing includes, for example, off-set printing operations, such as on a Heidelberg press, flexographic printing, and flat-bed printing.

The photoinitiators of the present invention enable increased press output due to the photoreactivity of the photoinitiators. Further, the increased output may be obtained while using a minimal amount of photoinitiator and a low energy light source. In one embodiment of the present invention, complete curing at an output rate of 10,000 printed sheets per hour may be obtained using a 50 W cold lamp as the light source.

Any of the above-described photoinitiators may be used in the printing processes disclosed herein. Desirably, the amount of photoinitiator added to the ink composition, adhesive composition or resin is less than about 4.0 wt % of the total weight of the composition. More desirably, the amount of photoinitiator added to the composition is from about 0.25 to about 3.0 wt % of the total weight of the composition. Most desirably, the amount of photoinitiator added to the composition is from about 0.25 to about 2.0 wt % of the total weight of the composition.

A major advantage of the photoinitiators of the present invention is that they enable rapid curing times of ink compositions, adhesive compositions and/or resins in comparison to the curing times of prior art photoinitiators. Ink compositions containing the photoinitiators of the present invention possess rapid curing times from 5–10 times faster than the curing times of ink compositions containing the best known photoinitiators. The use of the photoinitiators of the present invention in ink compositions, adhesive compositions or resins for printing presses enables print speeds, which were at one time thought to be unobtainable. For example, in an open air printing process using a Heidelberg print press and a 50 W excimer cold lamp for photocuring, desirably the printed sheet output is greater than 6,000 sheets per hour. More desirably, the printed sheet output is greater than 8,000 sheets per hour. Most desirably, the printed sheet output is greater than 10,000 sheets per hour.

The present invention is further described by the examples which follow. Such examples, however, are not to be construed as limiting in any way either the spirit or the scope of the present invention. In the examples, all parts are by weight, unless stated otherwise.

EXAMPLE 1

Method of Forming a 1-(p-fluorophenyl)-2-bromo-propan-1-one Intermediate to a Photoinitiator of the Present Invention The following reaction was carried out as detailed below:

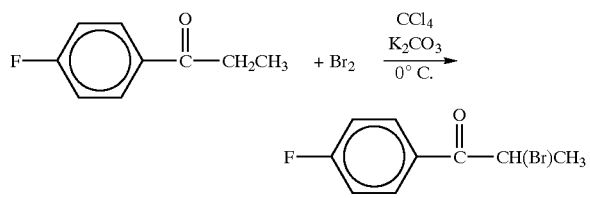

Into a three-necked round-bottom flask was placed 10.0 g (0.07 mole) of $K_2CO_3$ in 150 ml of carbon tetrachloride with stirrer bar. The mixture was cooled to about 0° C. Into the flask was added 40.0 g (0.28 mole) of 1-(p-fluorophenyl) propan-1-one. Bromine was slowly added to the mixture over a period of about 30 minutes. The temperature of the mixture was allowed to rise to room temperature over a period of about 60 minutes.

The reaction mixture was filtered and the solvent was removed under reduced pressure on a rotovaporator. The final product was used without further purification.

EXAMPLE 2

Method of Forming a 1-(p-fluorophenyl)-2-bromo-2-methyl-propan-1-one Intermediate to a Photoinitiator of the Present Invention The following reaction was carried out as detailed below:

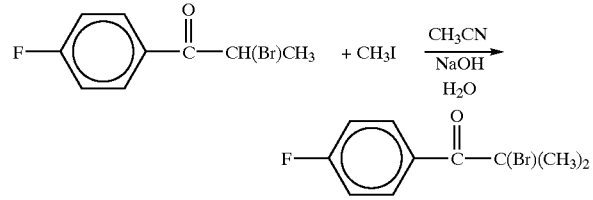

Into a three-necked round-bottom flask was placed 200 ml of acetonitrile with stirrer bar. Into the flask was added 50.0 g (0.22 mole) of 1-(p-fluorophenyl)-2-bromo-propan-1-one from Example 1 and 31.2 g (0.22 mole) of methyl iodine while stirring at room temperature. The mixture was stirred for about 12 hours. The solvent was reduced by half and 17.6 g (0.44 mole) of NaOH was added to the mixture. The mixture was heated to a range of about 50 to 60° C. for a period of about 30 minutes. After cooling, 200 ml. of water was added to the mixture. The mixture was then extracted with ether (2×70 ml.), dried over $MgSO_4$, and filtered. The solvent was then removed to yield a product, which was used without further purification.

EXAMPLE 3

Method of Forming a 1-(p-fluorophenyl)-2-amino-2-methyl-propan-1-one Intermediate to a Photoinitiator of the Present Invention The following reaction was carried out as detailed below:

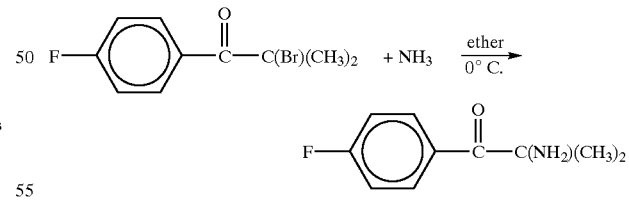

Into a three-necked round-bottom flask was placed 200 ml of ether with stirrer bar. Into the flask was added 45.0 g (0.19 mole) of 1-(p-fluorophenyl)-2-bromo-2-methyl-propan-1-one from Example 2. The mixture was cooled to about 0° C. Into the flask was bubbled ammonia gas for 2 hours, aster which was bubbled argon gas to flush away any excess ammonia. The solvent was then removed on the rotovaporator. The resulting product was used without further purification.

EXAMPLE 4

Method of Forming a Morpholino-Containing Intermediate to a Photoinitiator of the Present Invention The following reaction was carried out as detailed below:

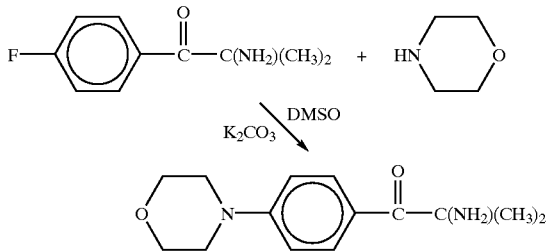

Into a 1-liter, three-necked round-bottom flask was placed 25.0 g (0.144 mole) of 1-(p-fluorophenyl)-2-amino-2-methyl-propan-1-one from Example 3, 12.5 g (0.144 mole) of morpholine, and 20.0 g (0.15 mole) of $K_2CO_3$ in 100 ml. of dimethylsulfoxide (DMSO). The mixture was flushed with argon and heated to reflux (160° C.) for about 12 hours under an argon atmosphere. The reaction mixture was cooled and filtered. The solvent was mixed with about 200 g of ice and extracted with dichloromethane. The organic layer was washed with 50 ml of a saturated salt solution, dried over $MgSO_4$, and then filtered. The solvent was removed by vacuum to yield 24.2 g of product (actual yield 68%).

The resulting product was found to have a $\lambda_{max}$ ($CH_3CN$) value of 314 nm, which indicated the presence of the 1-(morpholino)-2-amino-2-methyl-propan-1-one compound.

EXAMPLE 5

Method of Forming a Zn-complex Photoinitiator of the Present Invention

The following reaction was carried out as detailed below:
Into a 250 ml, three-necked round-bottom flask was placed

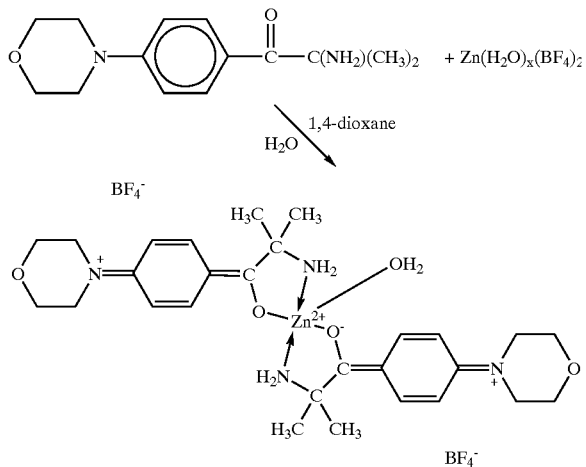

2.0 g (8.3 mmole) of zinctetrafluoroborate (Strem Chemical Company, Newburyport, MA), 4.1 g (16.6 mmole) of the morpholino-containing product of Example 4, 30 ml of water, and 30 ml of 1,4-dioxane. The mixture was stirred and heated to reflux. The color of the mixture changed from bright yellow to dull yellow after about 50 minutes. HPLC indicated that all of the starting materials converted to product. The starting material had an UV value, $\lambda_{max}$ ($CH_3CN$), of 314 nm, while the product had an UV value, $\lambda_{max}$ ($CH_3CN$), of 356 nm.

The solvent was removed and pumped under a vacuum (0.01 mm Hg) for about 16 hours at room temperature. The yield of the final product was 4.1 g of product (68%).

EXAMPLE 6

Testing of Zn-Containing Photoinitiator of the Present Invention in a Red Flexographic Resin A sample containing 2 wt % of the photoinitiator produced in Example 5 and 98 wt % of a red flexographic resin was prepared by mixing the components at about 50° C. in an aluminum pan. A drop of the resin sample was drawn down on a white panel using a zero-draw down bar. The thin film was exposed to a SOW excimer lamp (308 nm). The resin fully cured after 3 flashes (0.05 seconds/flash).

While the specification has been described in detail with respect to specific embodiments thereof, it will be appreciated that those skilled in the art, upon attaining an understanding of the foregoing, may readily conceive of alterations to, variations of, and equivalents to these embodiments. Accordingly, the scope of the present invention should be assessed as that of the appended claims and any equivalents thereto.

What is claimed is:

1. A photoinitiator having the general formula:

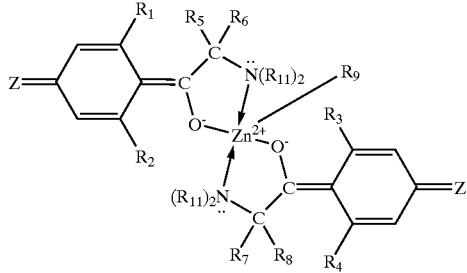

wherein Z each independently represents

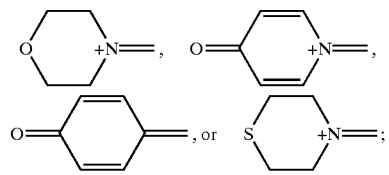

wherein $R_1$, $R_2$, $R_3$ and $R_4$ each independently represent hydrogen, an alkyl group having from one to six carbon atoms, an alkoxy group having from one to six carbon atoms, or a halogen-substituted alkyl group; $R_5$, $R_6$, $R_7$ and $R_8$ each independently represent an alkyl group having from one to six carbon atoms, an aryl group, or a halogen-substituted alkyl group having from one to six carbon atoms; wherein $R_9$ represents $(R_{10})_2O$ or $(R_{10})_3N$; wherein $R_{10}$ represents H or an alkyl group having from one to eight carbon atoms; and wherein $R_{11}$, represents H, an alkyl group having from one to eight carbon atoms, a benzyl group or an aralkyl group.

2. The photoinitiator of claim 1, wherein the photoinitiator comprises:

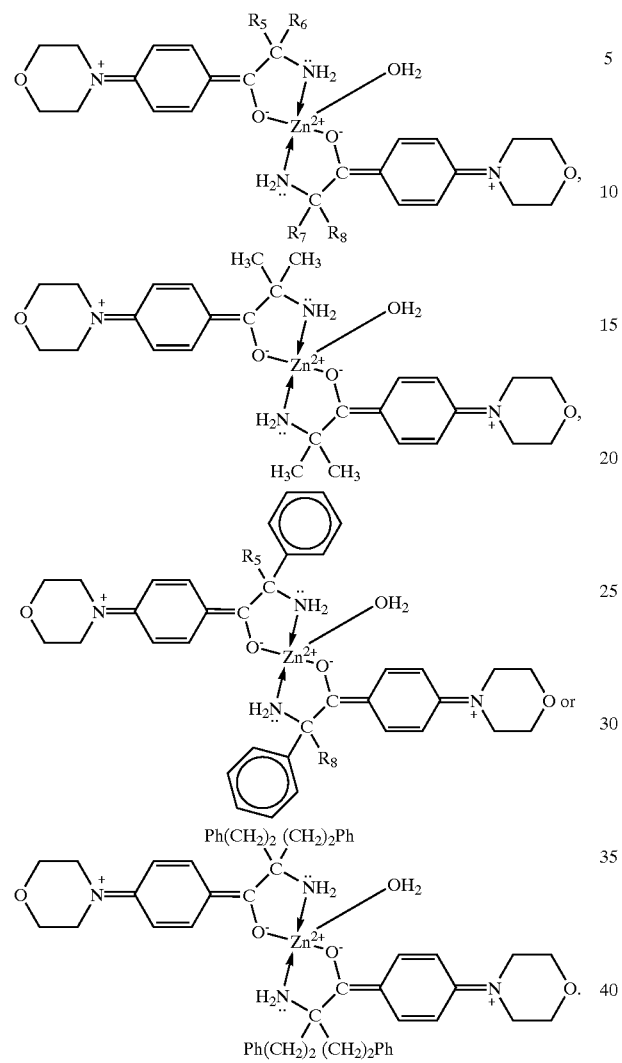

3. The photoinitiator of claim 1, wherein the photoinitiator is associated with one or more counterions.

4. The photoinitiator of claim 1, wherein the one or more counterions comprise tetraphenylboron, tetrachloroboron, tetrafluoroboron, hexafluorophosphate, perchlorate, or a combination thereof.

5. The photoinitiator of claim 4, wherein the one or more counterions comprise tetraphenylboron or tetrafluoroboron.

6. The photoinitiator of claim 3, wherein the photoinitiator and the one or more counterions comprise

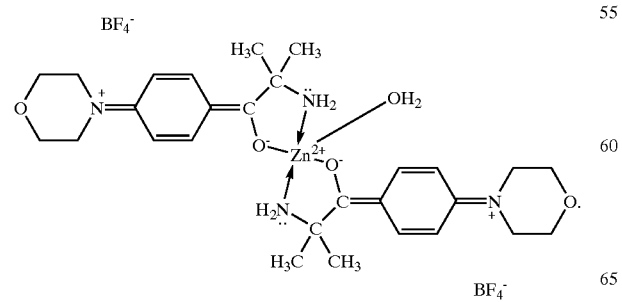

7. A method of generating a reactive species, comprising:

irradiating the photoinitiator of claim 1 with radiation.

8. A method of polymerizing a polymerizable material, comprising:

irradiating an admixture of a polymerizable material and the photoinitiator of claim 1.

9. A method of generating a reactive species, comprising:

irradiating a photoinitiator with radiation, wherein at least one cationic free radical and at least one nitrogen radical species are generated.

10. The method of generating a reactive species of claim 9, wherein the photoinitiator has the general formula:

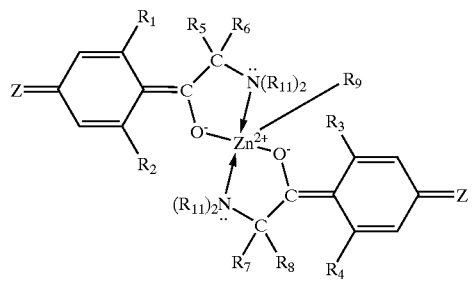

wherein Z each independently represent

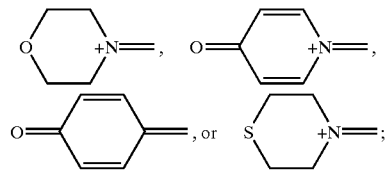

wherein $R_1$, $R_2$, $R_3$ and $R_4$ each independently represent hydrogen, an alkyl group having from one to six carbon atoms, an alkoxy group having from one to six carbon atoms, or a halogen-substituted alkyl group; $R_5$, $R_6$, $R_7$ and $R_8$ each independently represent an alkyl group having from one to six carbon atoms, an aryl group, or a halogen-substituted alkyl group having from one to six carbon atoms; wherein $R_9$ represents $(R_{10})_2O$ or $(R_{10})_3N$; wherein $R_{10}$ represents H or an alkyl group having from one to eight carbon atoms; and wherein $R_{11}$, represents H, an alkyl group having from one to eight carbon atoms, a benzyl group or an aralkyl group.

11. The method of generating a reactive species of claim 10, wherein the photoinitiator comprises:

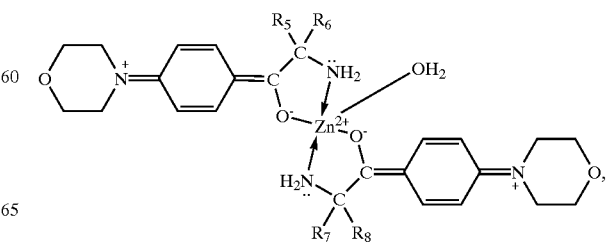

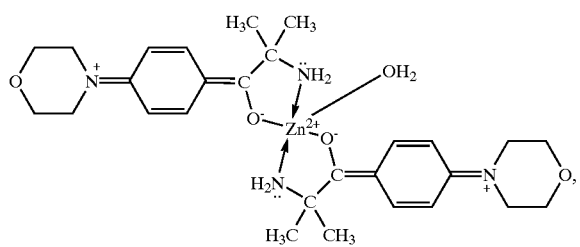

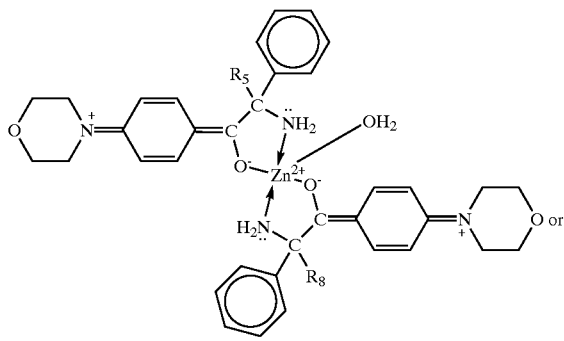

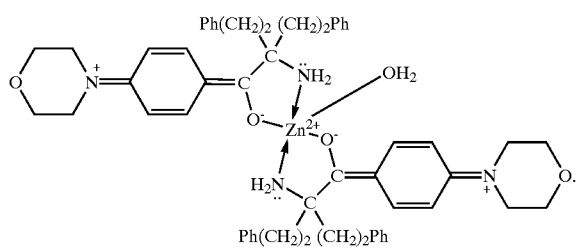

12. The method of generating a reactive species of claim 10, wherein the photoinitiator is associated with one or more counterions.

13. The method of generating a reactive species of claim 12, wherein the one or more counterions comprise tetraphenylboron, tetrachloroboron, tetrafluoroboron, hexafluorophosphate, perchlorate, or a combination thereof.

14. The method of generating a reactive species of claim 13, wherein the one or more counterions comprise tetraphenylboron or tetrafluoroboron.

15. The method of generating a reactive species of claim 12, wherein the photoinitiator and the one or more counterions comprise

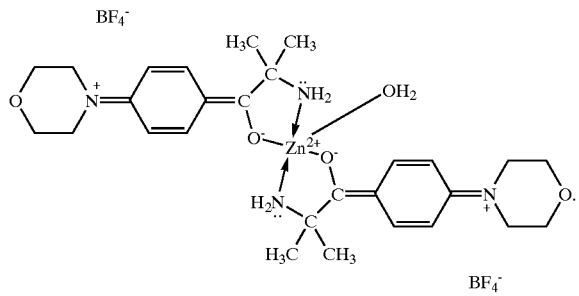

16. A photoreactive composition comprising at least one photoinitiator and at least one counterion, wherein the composition is capable of generating at least one cationic free radical and at least one nitrogen radical species.

17. The photoreactive composition of claim 16, wherein the photoinitiator having the general formula:

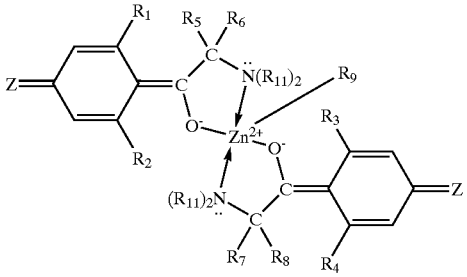

wherein Z each independently represent

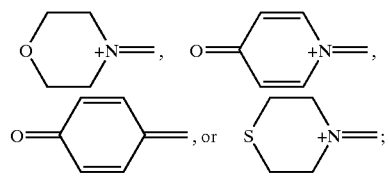

wherein $R_1$, $R_2$, $R_3$ and $R_4$ each independently represent hydrogen, an alkyl group having from one to six carbon atoms, an alkoxy group having from one to six carbon atoms, or a halogen-substituted alkyl group; $R_5$, $R_6$, $R_7$ and $R_8$ each independently represent an alkyl group having from one to six carbon atoms, an aryl group, or a halogen-substituted alkyl group having from one to six carbon atoms; wherein $R_9$ represents $(R_{10})_2O$ or $(R_{10})_3N$; wherein $R_{10}$ represents H or an alkyl group having from one to eight carbon atoms; and wherein $R_{11}$ represents H, an alkyl group having from one to eight carbon atoms, a benzyl group or an aralkyl group.

18. The photoreactive composition of claim 16, wherein the photoinitiator comprises:

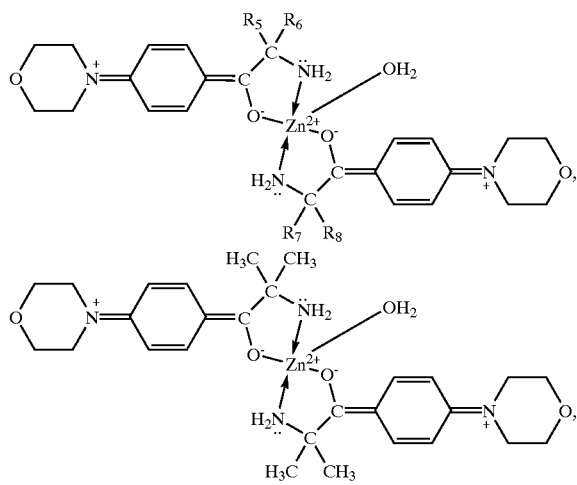

-continued
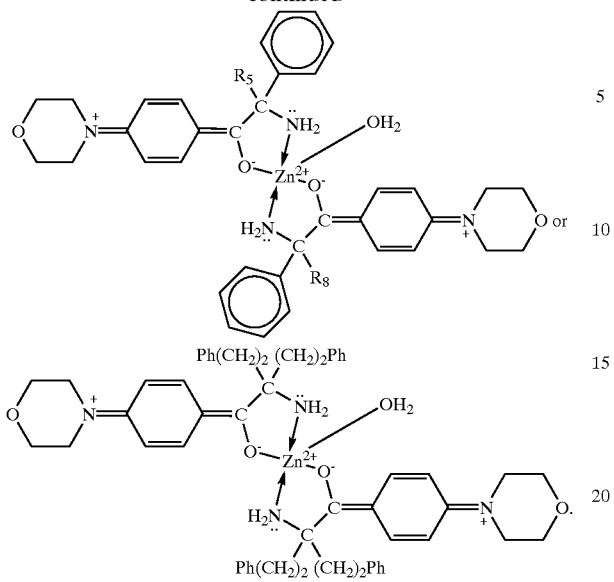
19. The photoreactive composition of claim 16, wherein the at least one counterion comprises tetraphenylboron, tetrachloroboron, tetrafluoroboron, hexafluorophosphate, perchlorate, or a combination thereof.
20. The photoreactive composition of claim 16, wherein the composition comprises
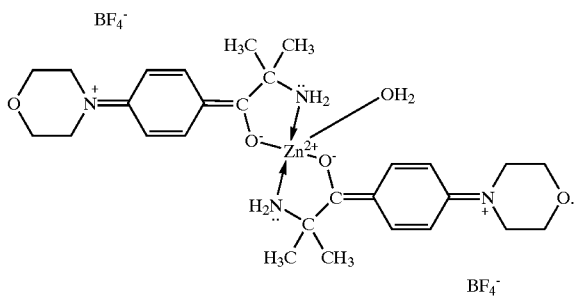
* * * * *